United States Patent
Ware et al.

(10) Patent No.: US 11,481,192 B1
(45) Date of Patent: *Oct. 25, 2022

(54) DUAL-DOMAIN COMBINATIONAL LOGIC CIRCUITRY

(71) Applicant: Rambus Inc., San Jose, CA (US)

(72) Inventors: Frederick A. Ware, Los Altos Hills, CA (US); John Eric Linstadt, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/363,940

(22) Filed: Jun. 30, 2021

Related U.S. Application Data

(63) Continuation of application No. 16/503,346, filed on Jul. 3, 2019, now Pat. No. 11,068,237.

(60) Provisional application No. 62/696,368, filed on Jul. 11, 2018.

(51) Int. Cl.
| | |
|---|---|
| *G06F 7/503* | (2006.01) |
| *G06F 7/502* | (2006.01) |
| *H03K 19/0185* | (2006.01) |
| *G06F 9/30* | (2018.01) |
| *H03K 19/00* | (2006.01) |

(52) U.S. Cl.
CPC ............ *G06F 7/503* (2013.01); *G06F 7/502* (2013.01); *G06F 9/3001* (2013.01); *G06F 9/30029* (2013.01); *H03K 19/0021* (2013.01); *H03K 19/018521* (2013.01)

(58) Field of Classification Search
None
See application file for complete search history.

(56) References Cited

U.S. PATENT DOCUMENTS

| | | | |
|---|---|---|---|
| 4,922,140 A | 5/1990 | Gahle et al. | |
| 6,320,446 B1 | 11/2001 | Podlesny et al. | |
| 6,803,793 B2 | 10/2004 | Inoue | |
| 10,447,270 B2 * | 10/2019 | Ware | H03K 19/20 |
| 10,784,868 B1 * | 9/2020 | Ware | H03K 19/0944 |
| 2008/0036538 A1 | 2/2008 | Lee | |
| 2016/0013763 A1 | 1/2016 | Tommatsu et al. | |
| 2019/0058460 A1 | 2/2019 | Pothireddy et al. | |

OTHER PUBLICATIONS

Ram K. Krishnamurthy et al, "Exploring the Design Space of Mixed Swing QuadRail for Low-Power Digital Circuits", IEEE Transactions on Very Large Scale Integration (VLSI) Systems, Dec. 1997, pp. 388-400, vol. 5, No. 4. 13 Pages.

* cited by examiner

*Primary Examiner* — Jany Richardson
(74) *Attorney, Agent, or Firm* — Charles Shemwell

(57) ABSTRACT

A combinational logic circuit includes input circuitry to receive a first and second input signals that transition between supply voltages of first and second voltage domain, respectively. The input circuitry generates, based on the first and second input signals, a first internal signal that transitions between one of the supply voltages of the first voltage domain and one of the supply voltages of the second voltage domain. Output circuitry within the combinational logic circuit generates an output signal that transitions between the upper and lower supply voltages of the first voltage domain in response to transition of the first internal signal.

20 Claims, 8 Drawing Sheets

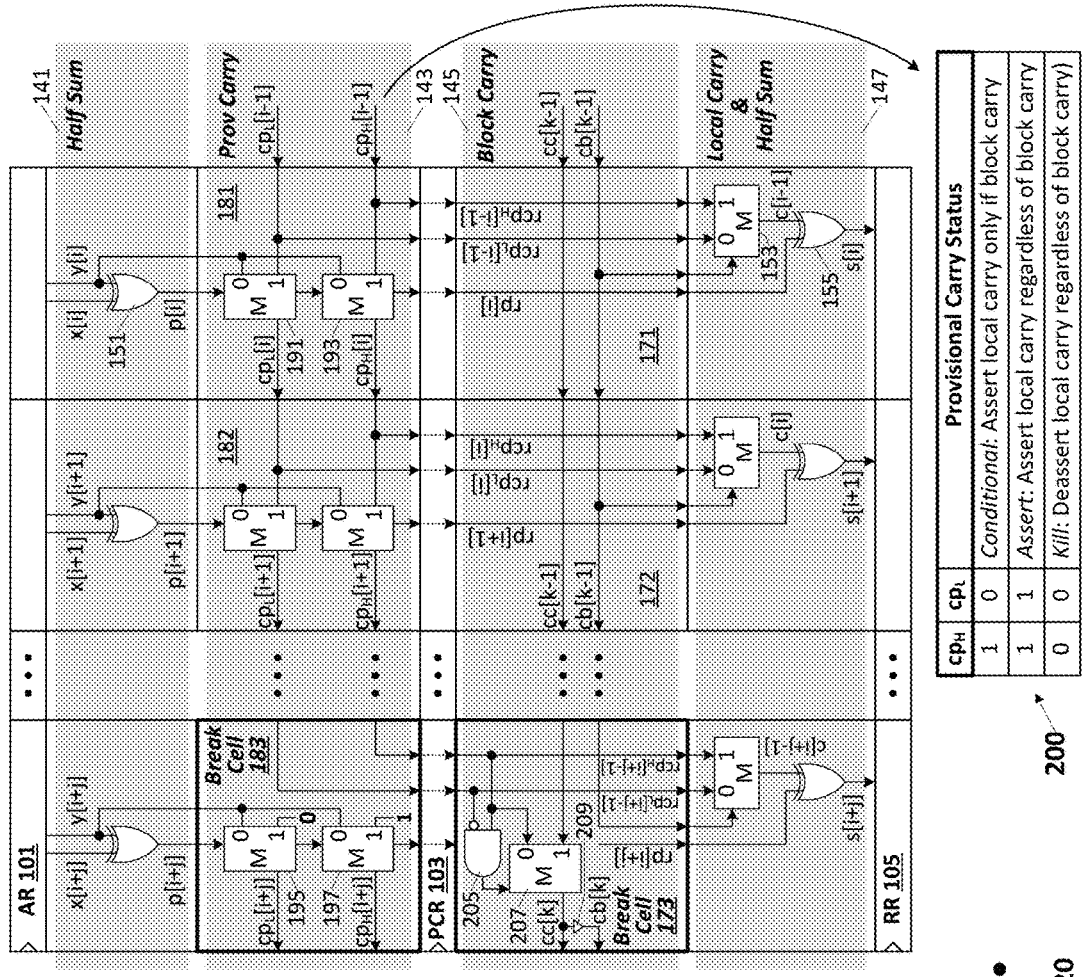
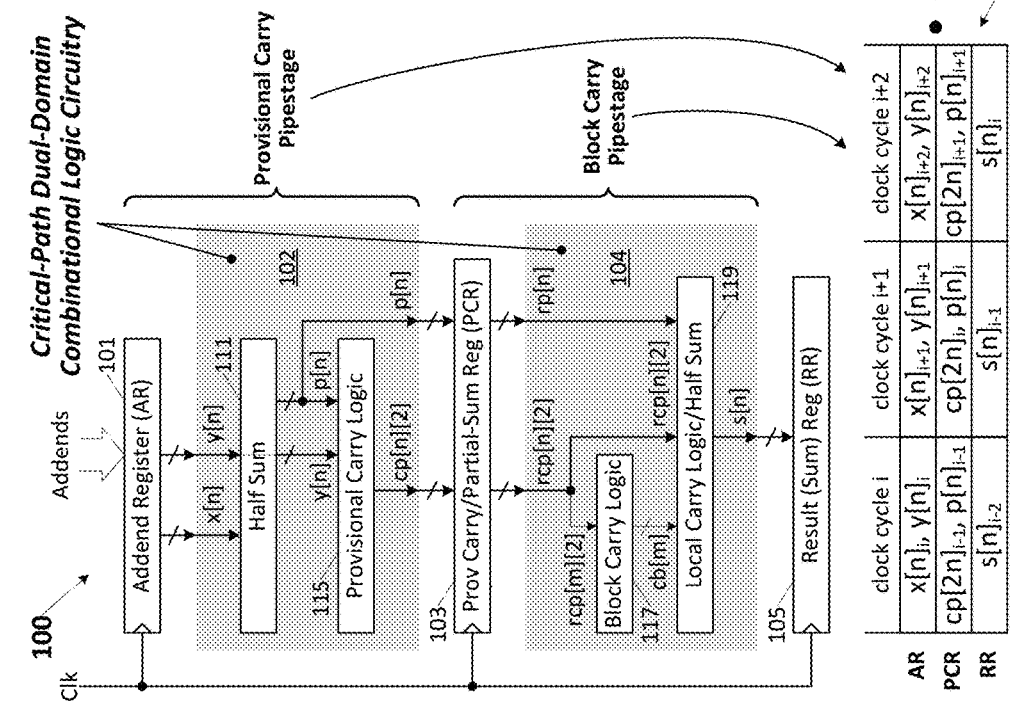

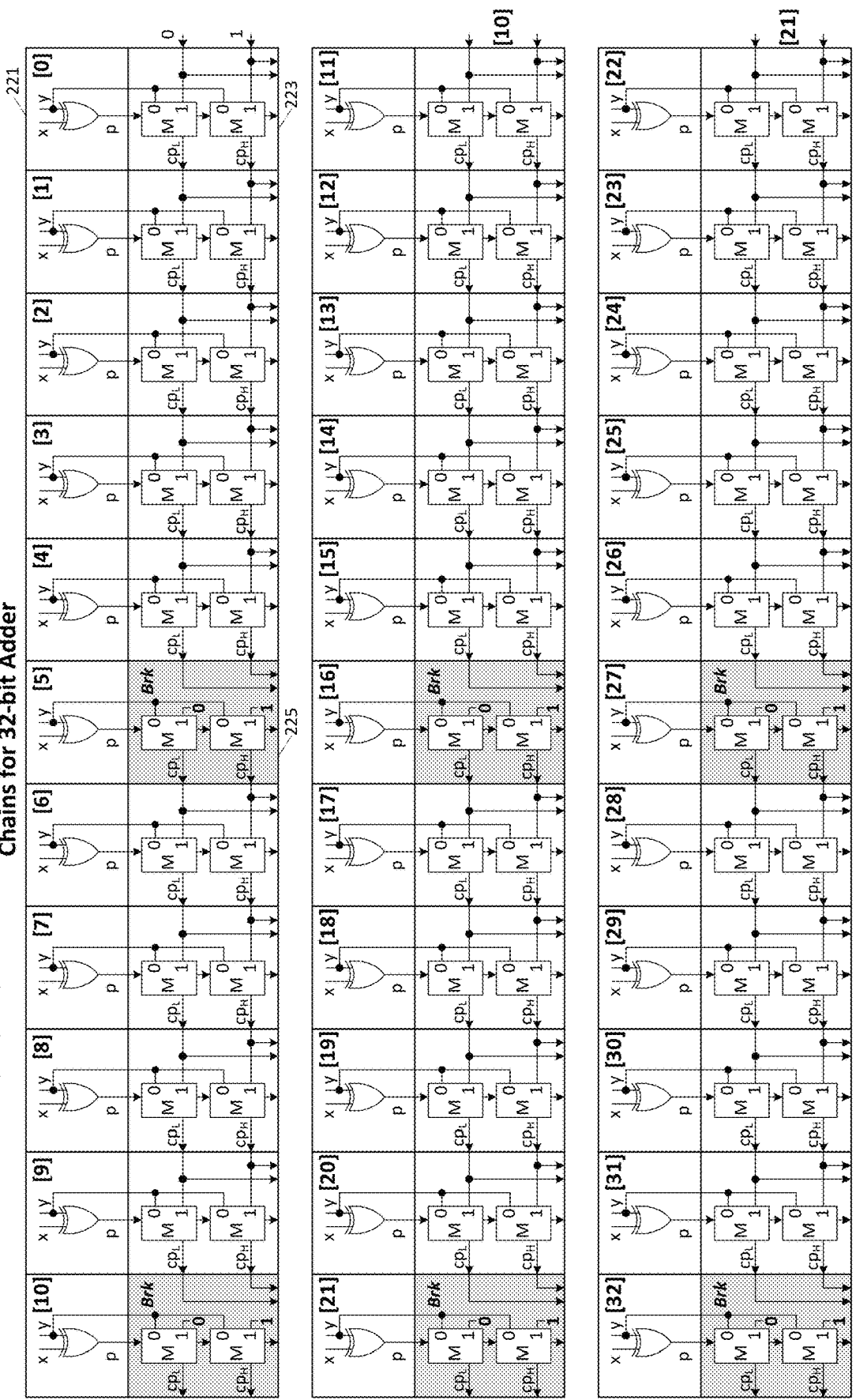
FIG. 3  Half-Sum Cells and Provisional-Carry Chains for 32-bit Adder

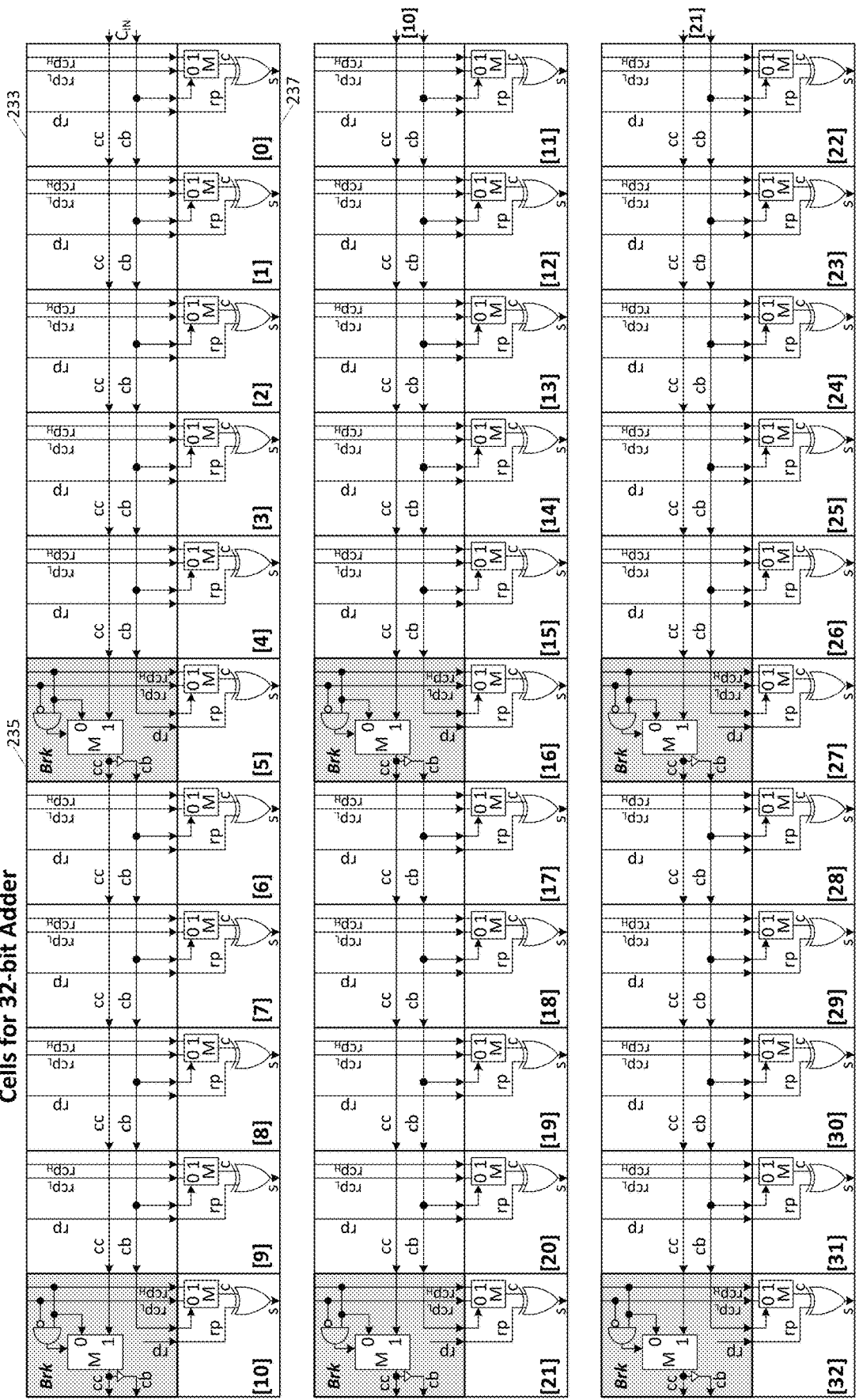
FIG. 4  Block-Carry Chains and Half-Sum Cells for 32-bit Adder

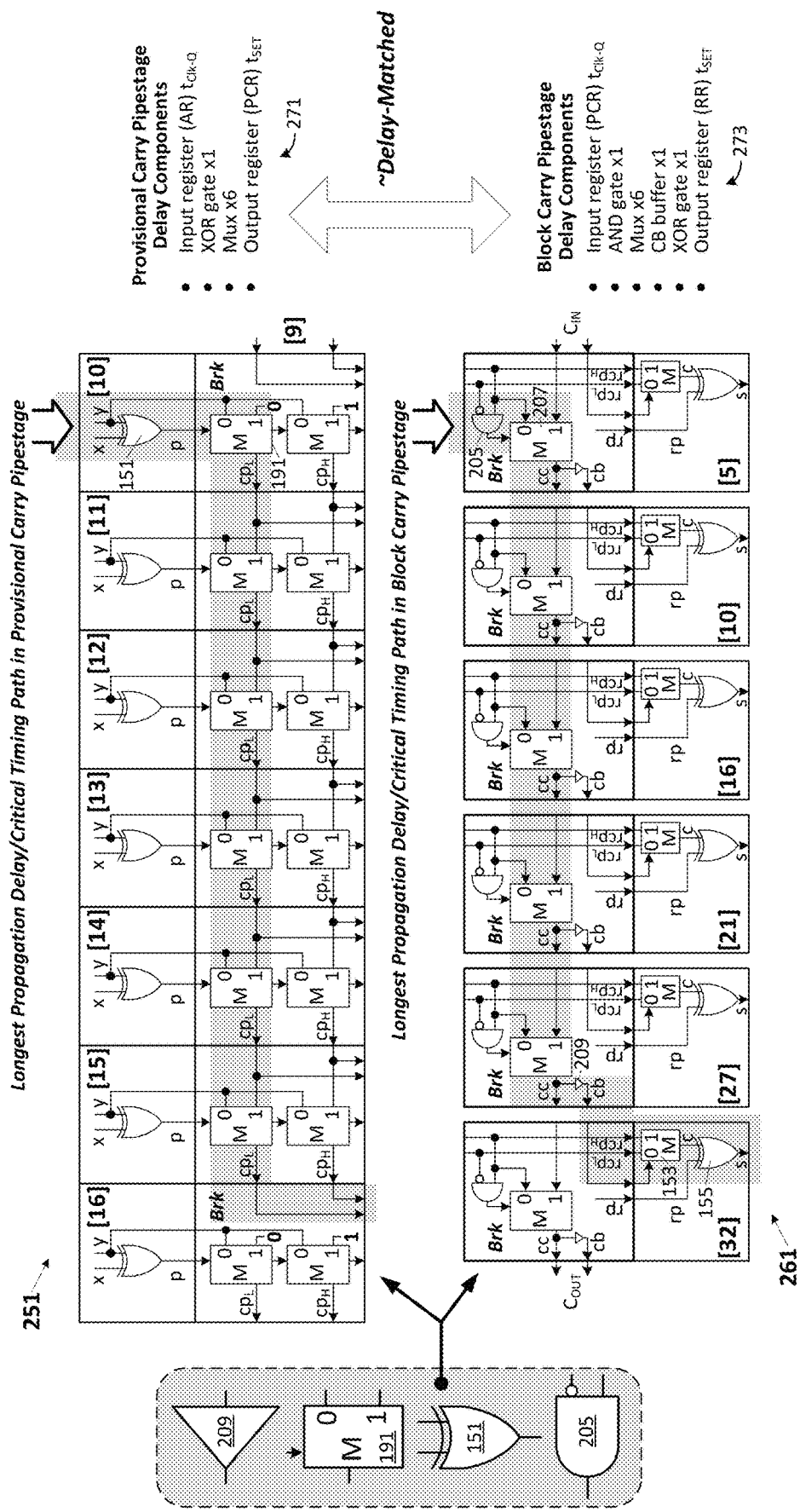
FIG. 5  Critical Combinational-Circuit Timing Paths

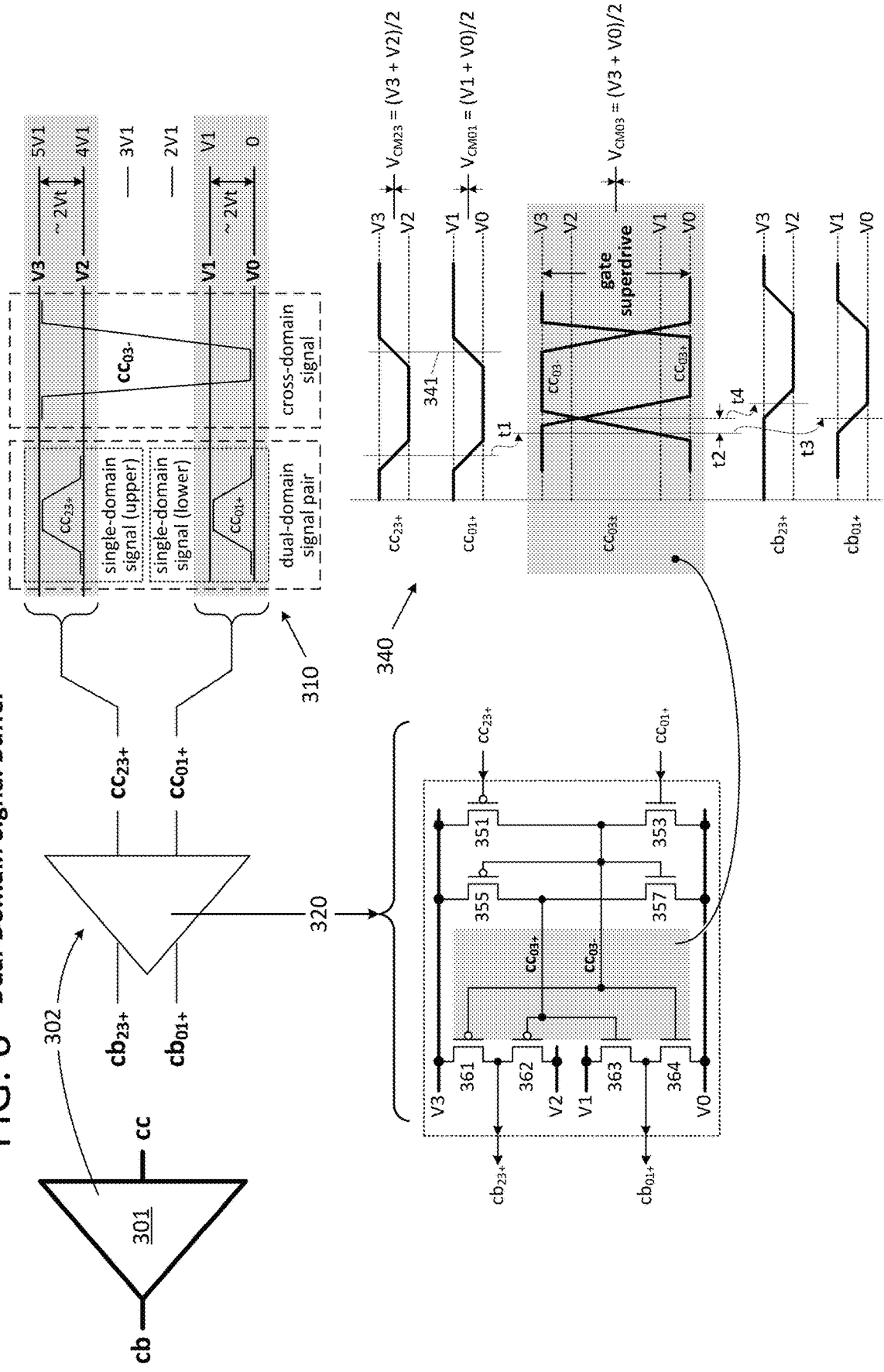
FIG. 6  Dual-Domain Signal Buffer

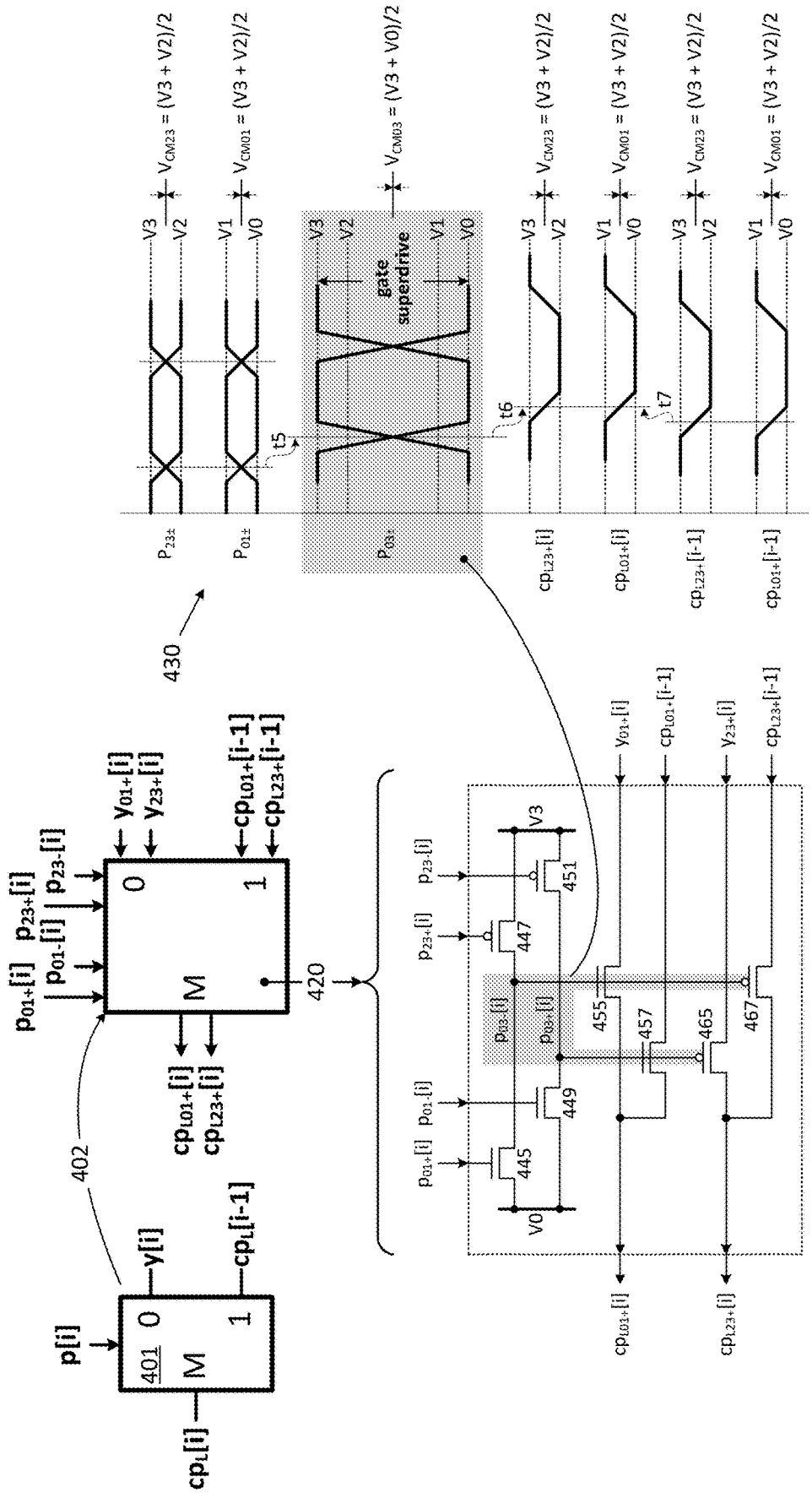
FIG. 7 Dual-Domain Multiplexer

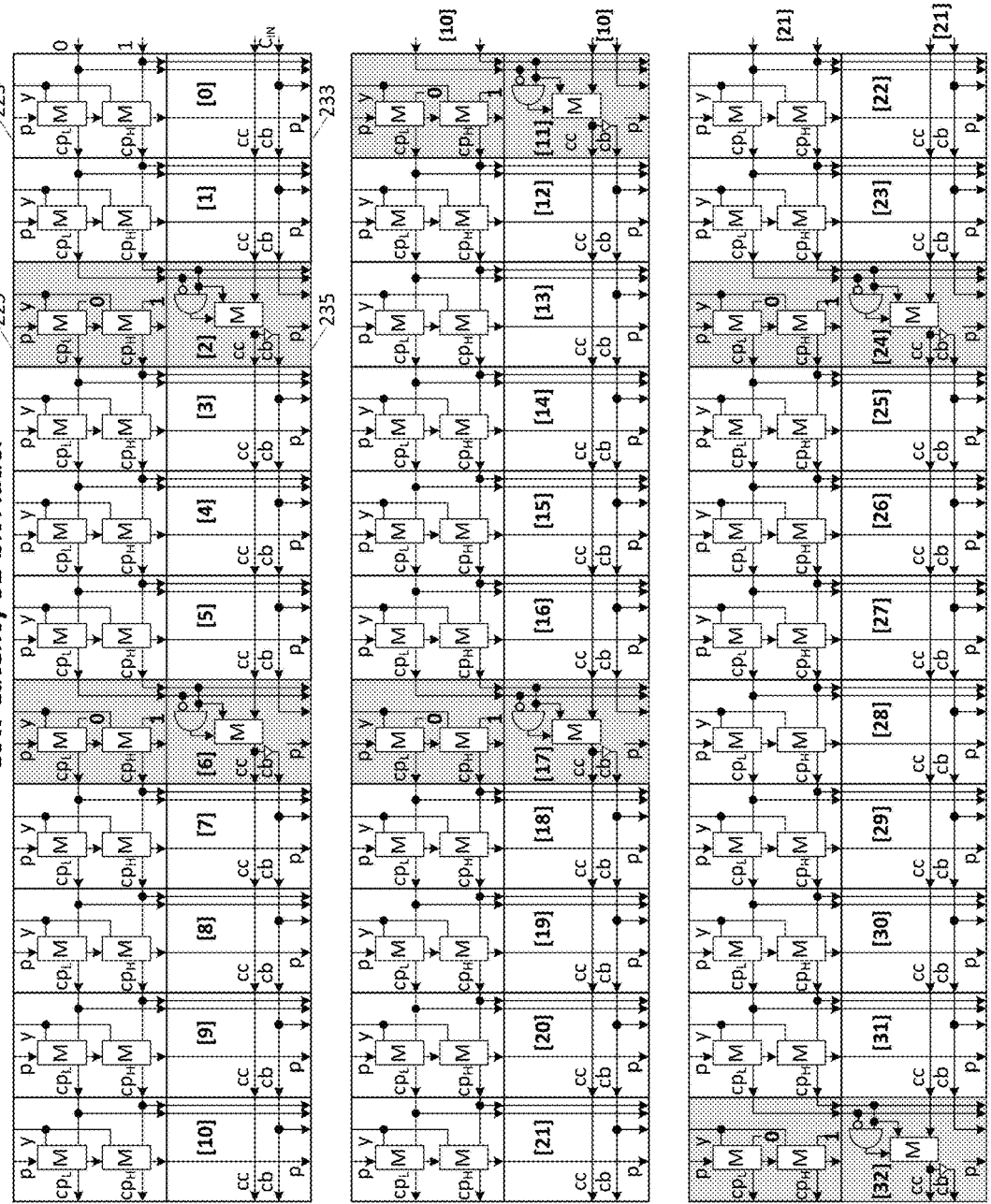
FIG. 11 Provisional-Carry Chains and Block-Carry Chains for Low-Latency 32-bit Adder
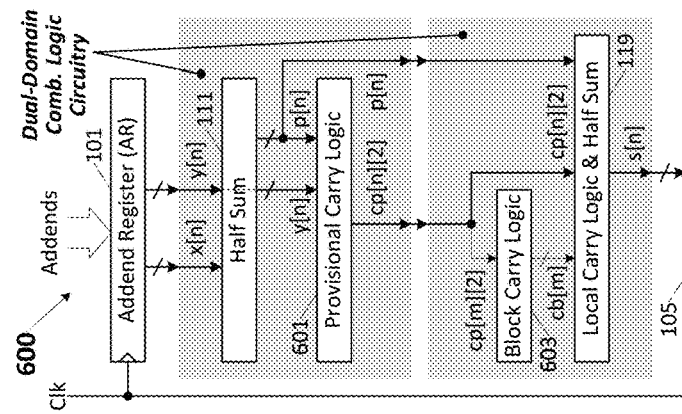
FIG. 10 Single-Stage Conditional-Carry Adder

DUAL-DOMAIN COMBINATIONAL LOGIC CIRCUITRY

CROSS REFERENCE TO RELATED APPLICATIONS

This application is a continuation of U.S. patent application Ser. No. 16/503,346 filed Jul. 3, 2019 (now U.S. Pat. No. 11,068,237), which claims the benefit of U.S. Provisional Application No. 62/696,368 filed Jul. 11, 2018. Each of the foregoing applications is hereby incorporated by reference.

TECHNICAL FIELD

The present disclosure relates generally to data processing and more particularly to high speed/high-throughput logic circuitry implemented in integrated circuit devices.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of a two-stage integrated-circuit digital adder having dual-domain combinational logic circuits disposed in the critical timing path between successive pairs of pipestage registers;

FIG. 2 illustrates a more detailed view of the combinational circuitry within the provisional-carry and block-carry pipestages of FIG. 1, depicting a slice through selected bit positions;

FIG. 3 illustrates exemplary combinational logic circuitry corresponding to the provisional-carry pipestage of FIG. 1 for a 32-bit adder;

FIG. 4 illustrates exemplary combinational logic circuitry corresponding to the block-carry pipestage of FIG. 1 for a 32-bit adder—circuitry that corresponds cell-for-cell to the provisional-carry pipestage circuitry of FIG. 3;

FIG. 5 illustrates an exemplary propagation delay balance between worst-case (longest) propagation delay paths within the provisional-carry and block-carry pipestages of FIGS. 3 and 4, as well as the combinational logic elements that constitute those critical-timing paths;

FIG. 6 illustrates an embodiment of a dual-domain signal buffer that may be deployed at least within the combinational logic circuitry described in reference to FIGS. 2, 4 and 5;

FIG. 7 illustrates an embodiment of a dual-domain multiplexer that may be used to implement any or all of the multiplexing elements shown in FIGS. 2-5;

FIG. 10 illustrates an exemplary single-stage (low-latency) conditional-carry adder architecture that may be used in place of or in combination with the two-stage (high-bandwidth) embodiment shown in FIG. 1; and FIG. 11 illustrates an embodiment of dual-domain provisional carry logic circuitry and block carry logic circuitry within a 32-bit low-latency adder.

DETAILED DESCRIPTION

Figures 8, 9:
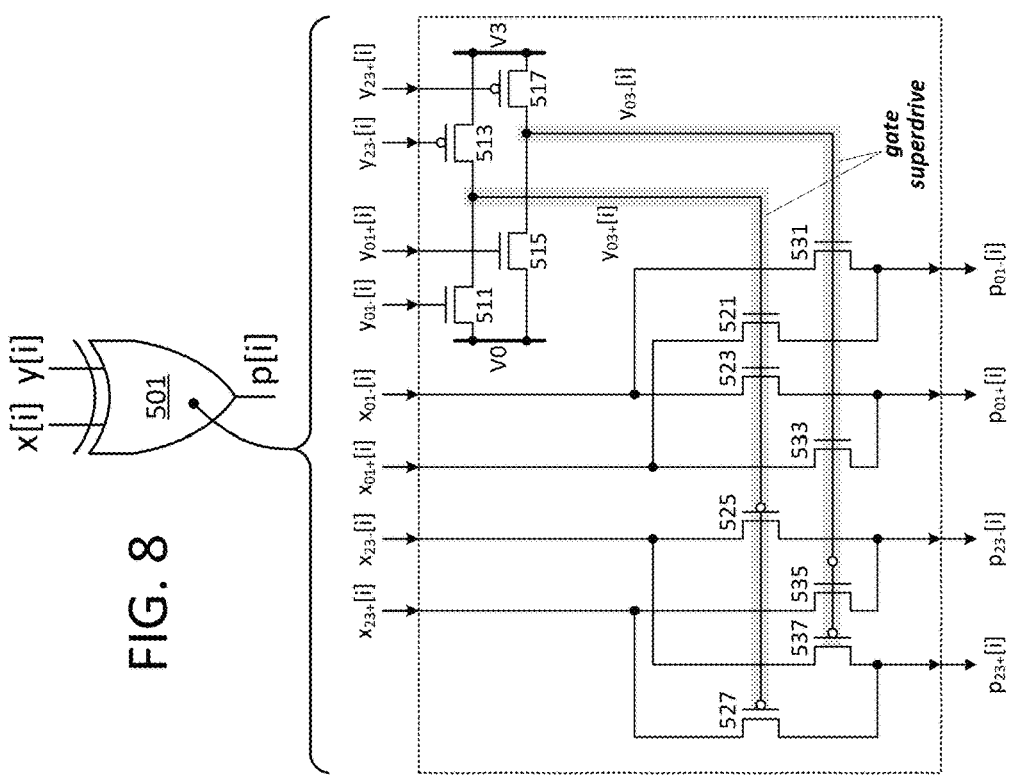
FIG. 8 illustrates an embodiment of a dual-domain exclusive-OR (XOR) gate that may be used to implement exclusive-OR gates shown in FIGS. 2-5.
FIG. 9 illustrates an embodiment of a dual-domain inverting-input AND gate that may be used to implement inverting-input AND gates shown in FIGS. 2, 4 and 5.

Combinational logic circuits having small-swing input/output interfaces and large-swing internal control nodes are disclosed in various embodiments herein. In a number of implementations, relatively large-swing voltages are developed at the internal control nodes (e.g., nodes coupled to gates of output-driving transistors) to yield increased small-swing output drive current and correspondingly reduced data output latency (i.e., as output line capacitance may be more rapidly charged and/or discharged)—a particularly beneficial result in voltage-scaled cryogenic applications as the reduced output latency mitigates otherwise increased transistor gate delay. In other embodiments, the increased output drive current is leveraged to increase output node fan-out, permitting wider (more parallel) circuit interconnection architectures than possible with conventional signaling circuits.

Small-swing input signals are generally delivered to the combinational logic circuits in two different/stratified voltage domains, with some input signals swinging between supply rails of an upper voltage domain and others swinging between supply rails of a lower voltage domain. In a number of embodiments, each of the dual-domain small-swing voltage domains (upper and lower) spans a voltage range approximately twice the threshold voltage of constituent transistors within the combinational logic circuitry, while the voltage between the high and low voltage rails of the upper and lower voltage domains, respectively, is on the order of 4, 5, 8, 10 (or more) times the transistor threshold voltage—an arrangement that enables generation of internal signals that transition between the two voltage domains and thus exhibit relatively large signal swings at internal nodes (i.e., as compared to smaller-swing signals at the input/output interfaces of the logic circuitry) coupled to output-drive transistor gates, yielding substantially increased output drive current and correspondingly faster output signal slew.

FIG. 1 illustrates an embodiment of a two-stage integrated-circuit digital adder 100 having dual-domain combinational logic circuitry 102 and 104 disposed in the critical timing path between successive pairs of pipestage registers 101/103, and 103/105. As discussed in connection with circuit details below, carry-bit signals propagate from bit position to bit position through chains of combinational circuits within adder 100, resulting in cumulative delays that constrain the register-to-register transfer rate and thus the clock rate within an integrated-circuit or digital system containing the adder (the "host IC" or "host chip"). In this regard, adder 100 and variants discussed below are generally representative of myriad combinational logic circuits disposed in time-critical signal paths (whether synchronous or asynchronous) and should be understood as such. For example, numerous alternative adder architectures (including various ripple-carry, conditional-carry and/or carry-lookahead embodiments) may be implemented using component elements of adder 100 (e.g., component elements as discussed below), and those component elements and variants thereof may be deployed within numerous other types of combinational logic circuitry (e.g., more general arithmetic logic units (ALUs), multipliers, switch fabrics, etc.).

Still referring to FIG. 1, a pair of n-bit addends, x[n] and y[n], are clocked into added register 101 (AR) for delivery to combinational logic circuits (collectively 102) within a provisional carry pipestage. More specifically, both addends are supplied to a half-sum circuitry 111 which, in turn, outputs an n-bit partial-sum, p[n], to provisional carry logic 115. Provisional carry logic 115 also receives one of the n-bit addends (the 'y[n]' addend in this example and those that follow) and produces a set of 'n' two-bit provisional-carry values, cp[n][2]. As shown, the provisional-carry values and partial sum are supplied to provisional-carry/partial-sum register 103 (PCR), thus establishing the first ("provisional carry") pipestage delay as the sum of (i) the clock-to-Q delay ($t_{Clk-Q}$) of addend register 101, (ii) the worst-case signal propagation delay through half-sum circuitry 111 and provisional carry logic 115, and (iii) the setup time delay ($t_{SET}$) of PCR register 103. Accordingly, after minimizing the register delays ($t_{Clk-Q}$ and $t_{SET}$), the combinational circuit delays through half-sum circuitry 111 and provisional carry logic 115 constrain the register-to-register transfer rate (i.e., from AR 101 to PCR 103) and thus the clock rate and throughput/bandwidth of the digital system.

Registered instances of the provisional carry values, rcp [n][2] and partial sum rp[n] are output (after a $t_{Clk-Q}$ interval) from PCR register 103 to combinational logic circuits within the block carry pipestage. More specifically, the 'n' provisional carry values rcp[n][2] are supplied (together with partial sum rp[n]) to local-carry/half-sum logic 119, while a subset 'm' of the 'n' provisional carry values (i.e., m<n) are supplied to block carry logic 117. Block carry logic 117 responds to the incoming provisional carry values by generating a corresponding set of 'm' block-carry values, cb[m], outputting those values to the local-carry/half-sum logic as shown. Local-carry/half-sum logic 119 applies the block carry values, provisional carry values and partial sum to produce final summation value s[n], outputting the summation value to result register 105 (RR) for storage therein at the subsequent clock (Clk) edge.

As in the provisional carry pipestage, the block carry pipestage is characterized by a three-part delay that includes (i) the clock-to-Q delay of PCR register 103 (ii) the worst-case signal propagation delay through block carry logic 117 and local-carry/half-sum logic 119, and (iii) the setup time delay of result register 105. Accordingly, the worst-case combinational circuit delay through block carry logic 117 and local carry/half-sum logic 119 constrains the register-to-register transfer rate (i.e., from PCR 103 to RR 105) and may thus limit the system bandwidth/clock rate if greater than the worst-case combinational circuit delay within the provisional carry pipestage. In a number of embodiments, the combinational circuits 102 and 104 within the provisional-carry and block-carry pipestages are (i) architected to balance (approximately equalize) their respective worst-case delays, and (ii) implemented with dual-domain elemental circuits to shrink those worst-case delays and thereby enable higher data throughput (higher clock rate/higher bandwidth).

An example of the pipelined operation enabled by the two-stage (two-cycle) architecture of FIG. 1 is depicted at 120. As shown, a new addend pair is loaded into addend register 101 during each clock cycle (cycle 'i' addends), while the provisional carry pipestage results from the prior-cycle addends ('i-1') are loaded into PCR register 103 and the summation value generated for addends from two cycles back ('i-2') is loaded into result register 105. In an alternative single-stage/single-cycle adder embodiment, discussed below, the intermediate PCR register 103 is omitted so that the entire add operation is carried out in a single clock cycle. In general, a single-stage implementation is constrained to a somewhat lower clock rate in view of the increased combinational delay (i.e., through the total combinational logic shown at 102 and 104 otherwise allocated to separate pipestages), but exhibits lower overall input-to-output latency. Thus the two-stage (two-cycle) adder shown in FIG. 1 is referred to herein as a high bandwidth embodiment in contradistinction to the low-latency single-stage (single-cycle) counterpart discussed below. In general, the high-bandwidth implementation yields higher performance in applications/systems characterized by relatively steady arithmetic throughput (e.g., relatively continuous streams of addition operations), while the low-latency implementation may yield higher performance in more arithmetically-bursty applications/systems.

FIG. 2 illustrates a more detailed view of the combinational circuitry within the provisional-carry and block-carry pipestages of FIG. 1, depicting a bit slice through adder bit positions 'i' and 'i+j'. As shown, half-sum stripe 141 (part of the provisional-carry pipestage shown in FIG. 1) is implemented by exclusive OR gates 151 at respective bit positions to produce partial sum values p[i], pi[i+1], p[i+j], while local-carry/half-sum stripe 147 (part of the block-carry pipestage in FIG. 1) is implemented by local-carry-select multiplexers 153 and exclusive OR gates 155 at respective bit positions to produce local-carry bits c[i-1], c[i-1], . . . , c[i+j-1] and final sum values s[i], s[i+1], . . . , s[i+j], respectively. The combinational circuitry within each bit position or "cell" for these two "half-sum" stripes (141 and 147) is isolated with respect to its lateral neighbors (i.e., cells within the same stripe), delivering outputs and/or receiving inputs only from the cells (or register) above or below. By contrast, provisional-carry and block-carry stripes 143 and 145 implement lateral signal propagation chains, in some cases through continuity cells (i.e., having signal conductors only) as in block-carry cells 171 and 172 of the block carry stripe, and in other cases through multiplexer elements as in propagation cells 181 and 182 of the provisional carry stripe. Referring specifically to provisional-carry stripe 143, a two-bit "provisional carry" value "cp" is conveyed on respective high-bit and low-bit signal lines ($cp_H$ and $cp_L$) with the input value to each provisional carry cell 181, 182, . . . 183 indexed according to the supplying (upstream) cell. Thus provisional-carry cell 181 in bit position 'i' receives provisional carry value cp[i-1] (i.e., signals $cp_L[i-1]$ and $cp_H[i-1]$) from its upstream neighbor (not shown) and supplies cp[i] (signals $cp_L[i]$ and $cp_H[i]$) to its downstream neighbor (cell 182) via multiplexer elements 191 and 193. As shown in table 200, the provisional carry value output by each provisional carry cell conveys one of three states according to the incoming partial-sum bit and incoming provisional carry value:

Conditional ($cp_H=1$, $cp_L=0$): assert local carry in downstream bit position only if block carry is true Assert ($cp_H=1$, $cp_L=1$): assert local carry in downstream bit position regardless of block carry state Kill ($cp_H=0$, $cp_L=0$): deassert local carry in downstream bit position regardless of block carry state The "Assert" provisional-carry state is generated within a given provisional carry cell [i] whenever a local carry (i.e., "c[i]" to be applied in the downstream bit position) is mandated by the addend inputs at the subject bit position and thus whenever both x[i] and y[i] are both nonzero (i.e., '1'). Conversely, the "Kill" provisional-carry state is generated a provisional carry cell [i] whenever x[i] and y[i] are both '0', so that no local carry is to be applied in the downstream bit position, even if the block carry bit is a '1'. Finally, the "Conditional" provisional-carry state is output in response to a nonzero partial sum (p[i]=x[i] XOR y[i]=1) in combination with an incoming Conditional provisional-carry value (i.e., $cp_H[i-1]=1$, $cp_L[i-1]=0$). The conditional provisional-carry state may be viewed as a neutral state that will trigger assertion or deassertion of the local carry bit within the downstream local carry/half-sum cell according to whether the block carry input to that cell is '1' or '0'.

Referring specifically to provisional carry cell 181 of FIG. 2, multiplexers 191 and 193 output a provisional carry value cp[i] in either the Kill or Assert states by forwarding addend bit y[i] to the multiplexer outputs in response a zero-value partial sum (p[i]=0). That is, if the exclusive OR of addend bits x and y is zero, then x and y are either both '0' or both '1', meaning that a '0' value for y[i] conveys the Kill state and a '1' value for y[i] conveys the Assert state. By contrast, if the partial sum is nonzero (one of bits x[i] and y[i] is '1' and the other is '0'), then the multiplexers forward the incoming cp[i−1] value as the outgoing cp[i] value (i.e., $cp_L[i]=cp_L[i-1]$ and $cp_H[i]=cp_H[i-1]$), propagating the incoming provisional-carry state (Assert, Kill or Conditional) to the provisional-carry input to the downstream cell.

Still referring to FIG. 2, the partial sum generated within each bit slice and the incoming provisional carry value are registered within provisional carry register 103 (PCR) for delivery to combinational circuitry within block-carry logic stripe 145. The registered provisional-carry signals ($rcp_L$, $rcp_H$) and registered partial-sum signals (rp) vertically traverse the continuity block-carry cells (e.g., cells 171 and 172), with constituent bits of the registered provisional carry value being supplied to respective input ports of multiplexer element 153 within the local-carry/half-sum cell of the same bit slice, and the partial-sum bit supplied to an input of a half-sum circuit (exclusive OR gate 155) of that same cell. An incoming block carry signal (cb) laterally traverses a set or chain of neighboring block-carry cells and is coupled in common to the control inputs of respective multiplexers 153 within those cells. By this arrangement, any conditional carry value that conveys a conditional carry state ($cp_H=1$, $cp_L=0$) will result in either a logic '1' or logic '0' local carry bit (c[i−1], c[i], . . . ) from multiplexer 155 according to the block carry signal state. By contrast, a conditional carry value in the assert state ($cp_H=1$, $cp_L=1$) or kill state ($cp_H=0$, $cp_L=0$) will yield a logic '1' or logic '0' local carry bit, regardless of block carry state. In any case, the local carry bit is supplied to the alternate input of exclusive-OR gate 155 to yield, at the output of that gate, a final sum value 's' that reflects a sum of the partial-sum value 'p' for that bit slice and the local carry rendered by the prior bit slice.

In the FIG. 2 embodiment, a duplicate "carry-continuity" instance (cc) of the block carry signal (cb) is conducted laterally across the block-carry stripe to a chain-terminating block-carry cell 173, referred to herein as a "block-carry break cell"—in this case shown within bit slice i+j. Break cell 173 regenerates a new block carry signal pair (cb[k], cc[k], in contradistinction to incoming block carry signal pair cb[k−1], cc[k−1]) to propagate through a subsequent block-carry cell chain, controlling carry-select multiplexers 153 within the corresponding local-carry/half-sum cells. The break cell 173 within the block-carry chain is accompanied by (i.e., disposed in the same bit slice as) a break cell within the provisional carry chain. As shown, the incoming provisional carry lines to provisional-carry break cell 183 (conveying $cp_H$ and $cp_L$, respectively) bypass inputs of multiplexers 195 and 197 within that cell, with those inputs instead being hard-wired to a Conditional-state provisional-carry value (i.e., $cp_H=1$, $cp_L=0$). Within block-carry break cell 173, upper and lower bit components of incoming registered provisional carry signal (i.e., $rcp_H[i+j-1]$ and $rcp_L[i+j-1]$) are supplied to non-inverting and inverting inputs of AND gate 205, with the upper bit $rcp_H[i+j-1]$ also being coupled to the '0' input port of multiplexer 207. The incoming carry-continuity signal (cc[k−1]) is supplied to the logic '1' input port of multiplexer 207, the output of AND gate 205 controls the multiplexer selection, and the multiplexer output drives the outgoing conditional-carry and block-carry signals (cc[k] and cb[k] with the latter, at least, being buffered by buffer element 209). By this arrangement, a conditional-state provisional carry value will select the incoming continuity-carry signal to drive the block carry (and continuity carry) line for the subsequent chain of block-carry cells, while a kill or assert state conveyed in the provisional carry value will yield a logic '0' or logic '1' value, respectively (i.e., in accordance with the incoming $rcp_H$ signal) as the subsequent-chain block carry signal.

FIG. 3 illustrates exemplary combinational logic circuitry corresponding to the provisional-carry pipestage of FIG. 1 for a 32-bit adder. As shown, half-sum cells 221, and provisional-carry cells (including propagation cells 223 and break cells 225 are implemented generally as discussed in reference to FIG. 2, with provisional carry inputs to the leading bit slice (i.e., corresponding to bit position [0]) are hardwired to the conditional state ($cp_H=1$, $cp_L=0$). In alternative embodiments, though those signals may be supplied in either the kill or assert position in accordance with a carry-out from another adder stage or from a prior addition operation within the same adder (i.e., such that a 64-bit or larger addition may be executed through successive 32-bit additions). Also, break cells 225 are disposed within the provisional carry logic stripe after every four or five propagation cells 223—an arrangement that achieves propagation time balance between the provisional carry pipestage and a corresponding block carry pipestage having a relatively small number (e.g., five) of block-carry break cells within the critical path.

FIG. 4 illustrates exemplary combinational logic circuitry corresponding to the block-carry pipestage of FIG. 1 for a 32-bit adder—circuitry that corresponds cell-for-cell to the provisional-carry pipestage circuitry of FIG. 3. Block-carry cells (including continuity cells 233 and break cells 235) and local carry/half-sum cells 237 are implemented generally as discussed in reference to FIG. 2, with block-carry inputs ("cc" and "cb") to the leading bit slice coupled to receive, as a carry-in value, the carry-out from a prior adder circuit or prior addition operation executed within the depicted circuit (i.e., as where successive 32-bit adds are executed within the 32-bit adder, with the carry-out from each addition operation recirculated as the carry-in to the subsequent addition). Break cells 235 are disposed within the block carry logic stripe after every four or five continuity cells 233, an arrangement that yields a worst-case (longest-delay) block-carry propagation delay that approximately matches the propagation delay through a six-cell provisional carry chain (i.e., provisional-carry break cell 225 followed by five propagation cells 223).

FIG. 5 illustrates an exemplary propagation delay balance between worst-case (longest) propagation delay paths within the provisional-carry and block-carry pipestages of FIGS. 3 and 4, as well as the combinational logic elements that constitute those critical-timing paths. Within provisional carry pipestage (i.e., fragment thereof shown at 251), the delay path begins with the clock-to-Q delay ($t_{Clk-Q}$) of the addend register (not shown), followed by the propagation delay through XOR gate 151, provisional carry signal propagation through six multiplexer elements 191, and finally the minimum setup time, $t_{SET}$, of the destination register (i.e., PCR register 103 as shown in FIGS. 1 and 2). This delay time is approximately balanced by the delay path within block carry pipestage (fragment 261) which also begins with $t_{Clk-Q}$ (of PCR register not shown), followed by propagation delay through AND gate 205, block carry signal propagation through five multiplexers 207 and then buffer element 209, provisional carry propagation through multiplexer 153, signal propagation delay through XOR gate 155 and finally $t_{SET}$ of the destination register (i.e., result register 105 as shown in FIGS. 1 and 2). Referring to the delay component tallies shown at 271 and 273, the block carry pipestage may have a slightly higher propagation delay due to the AND gate and buffer. As discussed below, however, buffer elements may be provided within the provisional carry pipestage (e.g., at the output of the half-sum gate to deliver the partial-sum to the two multiplexer control inputs and to the PCR register (i.e., buffer added in view of multiple loads) and multiplexers within both the block carry chain and/or the provisional carry chains may be implemented with output-drive buffers (i.e., so that buffer 209 may be omitted). Also, components within the block carry pipestage may be relocated within the provisional carry pipestage (e.g., moving AND gate 205 into the corresponding break cell of the provisional carry pipestage) or vice-versa as necessary to equalize/minimize worst-case timing paths within the two pipestages and thus potentially increase adder bandwidth/clock rate.

Still referring to FIG. 5, constituent combinational logic elements within the worst-case pipestage delay paths include a buffer element 209 (which, as discussed, may additionally be implemented at other locations within the delay paths and/or subsumed into other logic elements), multiplexer element 191/207, and Boolean logic gates 151/155 (XOR) and 205 (AND). In each instance, signal inversion may be implemented at inputs and/or outputs of a given element (e.g., as the inverting input shown within AND gate 205 within the block carry chain) and input and/or output signals may be single-ended (as shown) or differential. Further, as discussed in greater detail below, any or all of the depicted combination elements may be implemented by dual-domain circuitry to speed signal throughput and thus lower individual and cumulative propagation delays within the host combinational logic circuit.

FIG. 6 illustrates an embodiment of a dual-domain signal buffer 301 that may be deployed within the combinational logic circuitry described above (e.g., to implement buffer 209 as shown in FIGS. 2, 4 and 5). As shown in a more detailed input/output view 302, buffer 301 receives and outputs dual signal small-swing instances—carry-continuity (cc) and block-carry (cb) in this example—with each signal pair including a lower domain signal ($cc01+$ and $cb01+$) and an upper domain signal ($cc_{23+}$ and $cb_{23+}$). For ease of reference, signal lines are occasionally referred to herein by the names of the signals they conduct (distinguishing by context between signal line and conveyed signal) and the signal references themselves are subscripted to explicate the voltage domain to which the signal is constrained and the active signal level (low or high). In FIG. 1, for example, carry-continuity signal $cc_{01+}$ is an active high signal (indicated by '+') constrained to a lower voltage domain (i.e., "lower domain" signal that swings between the V0 and V1 voltage rails and thus "01"), while $cc_{23+}$ is an active high signal that swings between the V2 and V3 rails of an upper voltage domain (hence the "23" subscript). By contrast, the $cc_{03-}$ signal depicted within waveform diagram 310 and applied to the gates of output-drive transistors of dual-domain buffer 301 (as discussed below) is an active-low signal (indicated by '−') that swings between a lower domain voltage rail and an upper-domain voltage rail (V0 and V3, respectively, in this example)—a large-swing signal referred to herein as a cross-domain signal (or inter-domain signal or trans-domain signal) in view of its swing between respective rails of the upper and lower voltage domains. In the specific example shown, each of the upper and lower voltage domains span voltage ranges approximately twice the threshold voltage (Vt) of individual transistors within dual-domain buffer circuit 301. Also, the V3 rail (higher voltage rail of the upper domain) is ~5× the V1 rail (higher voltage rail of the lower domain) so that the cross-domain signal swing from V0 to V3 or vice-versa is approximately 10× the threshold voltage of constituent transistors of buffer circuit 301—an amplified gate overdrive or "superdrive" that enables substantially increased drain-to-source current through the output-drive transistors (as discussed further below) and thus substantially faster signal propagation (reduced propagation delay) through various combinations of combinational logic circuitry. The upper and or lower voltage domains may be implemented with voltage spans other than 2Vt in other embodiments, and the cross-domain signal swing may be more or less than 10Vt (e.g., 4Vt, 5Vt, 8Vt, 15Vt, 20Vt, 30Vt, 50Vt, etc.).

In a number of embodiments, the reduced signal propagation delay within the dual-domain buffer of FIG. 5 (and other dual-domain combination logic elements discussed below) is leveraged to enable voltage-scaled combinational logic circuit operation in exceedingly low temperature environments, including cryogenic environments generally under 100 K, and more specifically at or around the boiling point of liquid nitrogen (~77K) or even the boiling point of liquid helium (~4K). In embodiments targeted for operation in a ~4K environment, for example, the logic-domain voltage ($V_L=V_{DD}$) is scaled to approximately 10 mV (~100× lower than in a typical room temperature implementation) to yield a 2× gate overdrive of CMOS transistors having a ~5 mV threshold voltage; operating points that may reduce energy per operation by roughly 50× relative to execution of that same operation at room temperature. In such environments, increased transistor delay (first order inversely-proportional to $V_{DD}$-Vt) may be counteracted at least within critical-path combinational logic circuits using the cross-domain signaling approach shown in FIG. 6 (i.e., bridging otherwise separate voltage domains), enabling data rates at least 2× and possibly higher than those achievable with conventional CMOS signaling circuits.

In other embodiments, the offset between upper and lower voltage domains is set to achieve a relative minimum energy-delay product within the subject combination logic circuitry—achieving a best-case balance between bandwidth and energy consumption. Table 1 below, for example, presents approximate time-energy products for conventional (single-domain) and dual-domain combinational circuitry operating in a 4K environment (~5 mV CMOS transistor threshold voltage). Metrics for the single-domain implementation are listed at three different supply values (10 mV, 100 mV, 1000 mV), with the metrics for the smallest of those supply voltages (10 mV) serving as reference for remaining values within the table. As can be seen, a dual-domain combinational logic implementation strikes a beneficial balance between delay and energy consumption, yielding roughly 5× better time*energy performance than the baseline (10 mV) single-domain implementation (i.e., signal propagation roughly 5.5 time faster in exchange for only 20% more energy), 50× better time*energy performance than the 100 mV single-domain implementation (dual-domain signal propagation rate at 55% of the 100 mV single-domain implementation, but with ~83× less energy consumption) and 500× better than the 1000 mV single-domain implementation (propagation rate at 5.5% of the 1000 mV single-domain implementation, but with 8333× less energy consumption).

TABLE 1

| Configuration | Propagation Delay | Energy Consumption | Energy * Time |
|---|---|---|---|
| Single Domain V1-V0 = 10 mV | T1 (baseline) | E1 (baseline) | T1 * E1 |
| Single Domain V1-V0 = 100 mV | ~0.1 * T1 (~10× faster) | ~100 * E1 | ~10 * T1 * E1 |
| Single Domain V1-V0 = 1000 mV | ~0.01 * T1 (~100× faster) | ~10,000 * E1 | ~100 * T1 * E1 |
| Dual Domain V1-V0 =10 mV V3-V2 =10 mV V3-V0 =25 mV | ~0.18 * T1 (~5.5× faster) | ~1.2 * E1 | ~0.22 * T1* E1 |

Referring now to exemplary buffer circuit diagram 320 and corresponding read-out timing diagram 340 (not necessarily to scale), simultaneous low states of row signals $cc_{23+}$ and $cc_{10+}$ switch CMOS (complementary metal oxide semiconductor) transistors 351 and 353 on and off, respectively, to transition cross-domain signal $cc_{03-}$ (generated on an internal node of the buffer circuit) from V0 to V3, and thus to a potential that that superdrives the gate of output-drive transistor 364 (i.e., gate-to-source voltage, $V_{GS}$, substantially more than twice the transistor threshold voltage, $V_t$, producing increased source-to-drain current $i_{DS}$) to rapidly discharge output line $cb_{01+}$ to V0. More specifically, in a CMOS implementation of transistor 364, the transistor output current $I_{DS}$ (drain-to-source current) for a gate-to-source voltage ($V_{GS}$) above the transistor threshold voltage (Vt) is first-order proportional to the gate overdrive voltage (i.e., $V_{GS}$-$V_t$), so that substantially higher output current corresponding approximately to the ratio of the cross-domain potential |V3-V0| to the intradomain potential |V1-V0| (or |V3-V2|) is produced by the $cc_{03-}$ transition from V0 to V3 relative to that achieved if the same signal transitioned merely from V0 to V1. Accordingly, dual-domain buffer circuit may transition output line $cb_{01+}$ between intra-domain signal levels (discharge from V1 to V0 in this example) much more rapidly than possible with a conventional single-domain buffer circuit with equivalently sized transistors.

Signal $cc_{03-}$ is also coupled to the input (transistor gates) of a cross-domain inverter (formed by a series-coupling of p-type transistor 355 and n-type transistor 357 between the V0 and V3 voltage supply rails) to drive cross-domain signal $cc_{03+}$ low (i.e., to V0). The low-going $cc_{03+}$ signal superdrives the gate of p-type output-drive transistor 362, switching that transistor on with enhanced source-to-drain current to rapidly discharge output line $cb_{23+}$ to V2. When input signals $cc_{10+}$ and $cc_{23+}$ go high as shown at 341), $cc_{03-}$ and $cc_{03+}$ transition to V0 and V3, respectively, superdriving the gates of output-drive transistors 361 and 363 to rapidly charge output lines $cb_{23+}$ and $cc_{10+}$ to V3 and V1, respectively.

Still referring to FIG. 6, it can be appreciated from waveform diagram 340 that signals input to and output from dual-domain buffer circuit 301 are limited to relatively small voltage swings (i.e., between V0 and V1 in the lower domain and between V2 and V3 in the upper domain), while delay-critical internal nodes coupled to the gates of output-drive transistors 361, 362, 363 and 364 exhibit much larger voltage swings (between V0 and V3). This distinction between input/output (I/O) signal levels and delay-critical core signal levels may be viewed as a difference between the common mode voltages (VCM) of those signals, with the common mode of the large-swing signal being different from and appearing between (e.g., midway between in the depicted example) the common modes of the upper domain and lower domain small-swing signals. With regard to exemplary delay times t1-t4 shown in FIG. 6, t1 is the $cc_{01+}\rightarrow cc_{03-}$ inverter delay, t2 is the $cc_{03-}\rightarrow cc_{03+}$ inverter delay, t3 is the $cc_{03-}\rightarrow cb_{01+}$ inverter delay and t4 is the $cc_{03+}\rightarrow cb_{23+}$ inverter delay.

FIG. 7 illustrates an embodiment of a dual-domain multiplexer 401 that may be used to implement any or all of the multiplexing elements shown in FIGS. 2-5. Referring to exemplary input/output signal detail shown at 402, a differential dual-domain multiplexer-select signal (e.g., partial-sum signal, 'p', and thus $p_{01+}[i]$, $p_{01-}[i]$, $p_{23+}[i]$ and $p_{23-}[i]$) is supplied to the multiplexer select/control input while single-ended dual-domain signals are supplied to the input ports ($y_{01+}[i]$, $y_{23+}[i]$ at input port '0' and $cp_{L01+}[i-1]$, $cp_{L23+}[i-1]$ at input port '1') and generated at the multiplexer output ($cp_{L01+}[i]$, $cp_{L23+}[i]$).

Referring to exemplary circuit diagram 420 and corresponding timing diagram 430, active-high dual-domain select signal components $p_{01+}[i]$ and $p_{23+}[i]$ are supplied to gates of transistors 445 and 447 respectively, while active-low components of the dual-domain select signal ($p_{01-}[i]$, $p_{23-}[i]$) are supplied to gates of transistors 449 and 451. Transistors 445 and 447 are coupled in series between V3 and V0 voltage rails and transistors 449 and 451 are likewise coupled in series between those rails, with the drain interconnection of each transistor pair (445/447 and 449/451) constituting a cross-domain signal node ($p_{03-}[i]$, $p_{03+}[i]$) to superdrive the gates of a selected pair of pass-gate transistors 455, 457, 465 and 467. Referring to timing diagram 430, for example, when the select input is high ($p_{01+}[i]$=V1, $p_{23+}[i]$=V3, $p_{01-}[i]$=V0 and $p_{23-}[i]$=V2), transistors 445 and 451 are switched on (while transistors 447 and 449 are switched off) to transition cross-domain nodes $p_{03+}[i]$ and $p_{03-}[i]$ to V3 and V0, respectively, thus superdriving the gates of pass-gate transistors 457 and 467 to conduct (with enhanced output drive current) input signals $cp_{L01+}[i-1]$ and $cp_{L23+}[i-1]$ to outputs $cp_{L01+}[i]$ and $cp_{L23+}[i]$, respectively. Conversely, when the select input is low ($p_{01+}[i]$=V0, $p_{23+}[i]$=V2, $p_{01-}[i]$=V1 and $p_{23-}[i]$=V3), transistors 447 and 449 are switched on (while transistors 445 and 451 are switched off) to transition cross-domain nodes $p_{03-}[i]$ and $p_{03+}[i]$ to V3 and V0, respectively, and thereby superdrive the gates of pass-gate transistors 455 and 465 to conduct (with enhanced output drive current) input signals $y_{01+}[i]$ and $y_{23+}[i]$ to outputs $cp_{L01+}[i]$ and $cp_{L23+}[i]$, respectively. The relative timing and common mode voltages of the multiplexer inputs (including select signal inputs) and outputs are shown in timing diagram 430, together with the cross-domain signal timing and common mode. Though not specifically depicted in the timing diagram, input signals $y_{01+}[i]$ and $y_{23+}[i]$ have the same upper and lower domain voltage swings (and common-mode voltages) as input signals $cp_{L01+}[i-1]$ and $cp_{L23+}[i-1]$. The t5 delay depicted in FIG. 7 will be relatively long due to the low-swing gate voltage on input stage transistors 445, 447, 449 and 451 and the large (cross-domain) VAS swing across the those transistors (preferably driving a drain node with minimized capacitance. This relatively large (t5) delay occurs once per 32-bit addition time and transpires concurrently within each unbroken provisional carry chain cell group. The t6 delay is relatively short due to the superdriven gates and small drain-to-source swing of pass-gate-configured transistors 455, 465. This brief t5 delay occurs once per 32-bit addition cycle and, like the t5 delay, transpires concurrently within each unbroken carry chain (i.e., provisional carry chain/block between break cells). The t7 delay is also relatively short due to the superdriven gates and small drain-to-source swing of passgate-configured transistors 457, 467, though this delay is incurred multiple times (one to 8 times per block) per 32-bit addition and represents the output for the carry-propagate case.

FIG. 8 illustrates an embodiment of a dual-domain exclusive-OR (XOR) gate 501 that may be used to implement exclusive-OR gates shown in FIGS. 2-5. In the depicted example, a differential dual-domain input signal is supplied to each of the XOR gate inputs (e.g., 'x' addend signal: $x_{01+}[i]$, $x_{01-}[i]$, $x_{23+}[i]$ and $x_{23-}[i]$; and 'y' addend signal: $y_{01+}[i]$, $y_{01-}[i]$, $y_{23+}[i]$ and $y_{23-}[i]$) and a differential dual-domain output signal is generated at the XOR output (e.g., partial-sum signal 'p', including components: $p_{01+}[i]$, $p_{01-}[i]$, $p_{23+}[i]$ and $p_{23-}[i]$). Active-low dual-domain input signal components $y_{01-}[i]$ and $y_{23-}[i]$ are supplied to gates of transistors 511 and 513, respectively, while active-high input signal components $y_{01+}[i]$ and $y_{23+}[i]$ are supplied to gates of transistors 515 and 517. Transistors 511 and 513 are coupled in series between V0 and V3 voltage rails and transistors 515 and 517 are likewise coupled in series between those rails, with the drain interconnection of each transistor pair (511/513 and 515/517) yielding a respective cross-domain signal ($y_{03+}[i]$ and $y_{03-}[i]$) coupled to the gates of respective sets of four pass-gate transistors 521, 523, 525 and 527, and 531, 533, 535 and 537. The two sets of pass-gate transistors are coupled in respective pairs between opposite polarity instances of the dual-domain 'x' input signal and a corresponding partial-sum output signal. By this arrangement, when y[i] is '0', cross-domain signals $y_{03-}$ and $y_{03+}$ are driven to V3 and V0, respectively, to superdrive the gates of transistors 525, 527, 531 and 533 (switching off transistors 521, 523, 535 and 537) and thereby pass the active-high and low x[i] input signal components to the same-polarity 'p' output signal lines. In that case, if x[i] is '0' (meaning that the XOR result is '0' as y[i] is also '0'), the V0-valued $x_{01+}$ signal component is passed to $p_{01+}$; V1-valued $x_{01-}$ is passed to $p_{01-}$; V2-valued $x_{23+}$ is passed to $p_{23+}$; and V3-valued $x_{23-}$ is passed to $p_{23-}$. Conversely, if x[i] is '1' (i.e., while y[i] is zero, meaning that the XOR result is '1'), V1-valued $x_{01+}$ signal component is passed to $p_{01+}$; V0-valued $x_{01-}$ is passed to $p_{01-}$; V3-valued $x_{23+}$ is passed to $p_{23+}$; and V2-valued $x_{23-}$ is passed to $p_{23-}$. When y[i] is '1', cross-domain signals $y_{03+}$ and $y_{03-}$ are driven to V3 and V0, respectively, to superdrive the gates of transistors 521, 523, 535 and 537 (switching off transistors 525, 527, 531 and 533) and thus yield a logic '1' output ($p_{23+}$=V3, $p_{23-}$=V2, $p_{01+}$=V1, $p_{01-}$=V0) when x[i] input is '0' and a logic '0' output ($p_{23+}$=V2, $p_{23-}$=V3, $p_{01+}$=V0, $p_{01-}$=V1) when x[i] is '1'. Various other dual-domain XOR logic gate implementations are possible, including circuit arrangements that incorporate a buffer element (e.g., as shown in FIG. 6) at the output-drive stage of the XOR gate.

FIG. 9 illustrates an embodiment of a dual-domain inverting-input AND gate 551 that may be used to implement inverting-input AND gates shown in FIGS. 2, 4 and 5. In the depicted example, the $cp_L$ input is inverted by a dual-domain inverter 553 and supplied to dual-domain AND gate 555, with exemplary implementations of those dual-domain logic elements shown at 554 and 556, respectively. Dual-domain inverter 553 is implemented (in the depicted embodiment) by upper-domain and lower-domain inverters 561 and 565, each constituted by a P-MOS/N-MOS transistor pair coupled in series between respective upper-domain and lower-domain supply rails. Thus, transistor pair 562/563 is coupled between the V3 and V2 supply rails (upper domain rails) with gates of those transistors coupled to receive active-high upper-domain input $cp_{L23+}$ and the interconnected drains of those transistors yielding inverted (active-low) upper-domain output signal $cp_{L23-}$. Transistor pair 566/567 is coupled between the V1 and V0 supply rails (lower domain rails) with gates of those transistors coupled to receive active-high lower-domain input $cp_{L01+}$ and the interconnected drains of those transistors yielding inverted lower-domain output signal $c_{pL01-}$.

Referring now to the exemplary AND gate implementation shown at 556, a dual-domain AND function is implemented by PMOS transistor pair 571/573 and NMOS transistor pair 575/577, with (i) the PMOS transistor pair coupled in parallel between upper domain rail V3 and active-low cross-domain signal node $mc_{03-}$, and the NMOS transistor pair coupled in series between cross-domain signal node $mc_{03-}$ and lower-domain rail V0. As shown, gates of the PMOS transistors 571 and 573 are coupled to receive upper-domain input signals $cp_{H23+}$ and $cp_{L23-}$, respectively, while gates the NMOS transistors 575 and 577 are coupled to receive the counterpart lower-domain input signals $cp_{H01+}$ and $cp_{L01-}$. By this arrangement, if either (or both) of the input signals is false (i.e., $cp_{L23-}/cp_{L01-}$=V2/V0 and/or $cp_{H23+}/cp_{H01+}$=V2/V0, at least one of PMOS transistors 571 and 573 will be switched on to couple active-low cross-domain node $mc_{03-}$ to V3, while at least one of NMOS transistors 575 and 577 will be switched off to isolate node $mc_{03-}$ from V0. Conversely, if both inputs signals are true (i.e. $cp_{L23-}/cp_{L01-}$=V3/V1 and $cp_{H23+}/cp_{H01+}$=V3/V1), then both PMOS transistors 571 and 573 will be switched off to isolate active-low cross-domain node $mc_{03-}$ from the V3 rail, while both NMOS transistors 575 and 577 will be switched on to couple node $mc_{03-}$ to V0. Accordingly, signal mc03− constitutes a cross-domain NAND output (i.e., inverted AND output) which is supplied to gates of transistors 581 and 583 (i.e., forming a cross-domain inverter) to yield an active-high AND output on node $mc_{03+}$.

Transistor pairs 585/587 and 595/597 are provided to convert the active-low and active-high cross-domain AND signals $mc_{03-}$ and $mc_{03+}$ into a high-current (high $i_{DS}$) active-high dual-domain output signal, $mc_{23+}$ $mc_{01+}$. As shown, PMOS transistors 585 and 595 are series-coupled between upper-domain supply rails V3 and V2, while NMOS transistors 587 and 597 are series-coupled between lower-domain supply rails V1 and V0—the drain-interconnection of those two sets of transistors 585/595 and 587/597 constitute the dual-domain AND gate outputs, $mc_{23+}$ and $mc_{23-}$. Active-low cross-domain signal $MC_{03-}$ is coupled to gate terminals of transistors 585 and 587 and thus, when high (V3), turns on transistor 587 to overdrive the gate of transistor 587 and thus drive V0 at the $mc_{01+}$ output, and, when low (V0), turns on transistor 585 to overdrive the gate of PMOS transistor 585 and thus drive V3 at the $mc_{23+}$ output. Active-high cross-domain signal $MC_{03+}$ performs the converse function, superdriving the gate of transistor 597 to drive V1 at the $mc_{01+}$ output when high (i.e., while $mc_{03-}$ is low and thus producing V3 at the $mc_{23+}$ output) and superdriving the gate of transistor 595 to produce V2 at the $mc_{23+}$ output when low (i.e., while $mc_{03-}$ is high and thus producing V0 at the $mc_{01+}$ output). Various other dual-domain AND logic gate implementations may be implemented in alternative embodiments, including circuit arrangements that incorporate a pass-gate-configured transistors (e.g., as shown in the XOR gate of FIG. 7) with our without an output-drive buffer element.

FIG. 10 illustrates an exemplary single-stage (low-latency) conditional-carry adder architecture 600 that may be used in place of or in combination with the two-stage (high-bandwidth) embodiment shown in FIG. 1. In general, the single-stage (single-cycle) architecture includes combinational logic circuitry similar to that the two-stage (two-cycle), with some modifications within the provisional carry logic 601 and block carry logic 603 to account for their direct interconnection (i.e., no intervening PCR register as in FIG. 1). Thus, half-sum circuitry 111 receives the n-bit x and y addends from AR register 101, and generates partial-sum p[n] in response. Provisional carry logic 601 receives the partial sum values and one of the addends (y[n] in the depicted example) and, in response, generates a set of n two-bit provisional carry values (cp[n][2]). A subset (m) of the provisional carry values are supplied to block carry logic 603 which outputs block carry signals cb[m] in response. Local carry/half-sum logic 119 receives the block carry and provisional carry values and generates a final summation value (s[n]) in response—the summation value being captured within result register 105.

FIG. 11 illustrates an embodiment of dual-domain provisional carry logic circuitry and block carry logic circuitry (e.g., that may be used to implement components 601 and 603, respectively within adder 600 of FIG. 10) within a 32-bit low-latency adder. The provisional carry logic includes propagation cells 223 and break cells 225 implemented generally as discussed above in reference to FIGS. 2, 3 and 5, and the block carry logic likewise includes continuity cells 233 and break cells 235 implemented generally as discussed with respect to FIGS. 2, 4 and 5. All cells may be implemented with the dual-domain combinational logic circuit elements and variants thereof discussed in reference to FIGS. 6-9.

In contrast to the two-cycle high-bandwidth approach discussed in regard to FIGS. 1-5, propagation delays within the single-cycle provisional carry chain and block carry logic are cumulative, with the time required for a block carry signal to arrive at a given block-carry break cell 235 (except the first) being dependent on the propagation delay through the preceding block-carry break cell and the provisional carry chain that feeds the preceding block-carry break cell. Thus, the time required for block carry signal arrival at the block-carry break cell in bit position [6] includes the time required for provisional carry signals to traverse multiplexers within provisional carry cells for bit positions [0] and [1], plus the propagation delay through the AND gate and block-carry multiplexer within block-carry break cell in bit position [2]. To match this delay, the provisional carry chain that begins with the provisional carry break cell in bit position [2] is extended by two additional provisional carry propagation cells—a consequence that further delays the time required for block carry delivery to the block-carry break cell in bit position [11], with attendant increase in the provisional carry chain that begins with provisional carry break cell in bit position [6] and so forth through the 32-bit length of the adder. In the particular embodiment shown, the longest delay path—the block carry signal delivery to the block-carry break cell in bit position [32] is approximately matched (or even slightly exceeded) by the 8-cell provisional carry chain that commences at the provisional carry break cell in bit position 24. Comparing this worst-case 8-cell delay to the worst-case 6-cell delay in the high-bandwidth embodiment of FIGS. 1-5, the low-latency embodiment is approximately 33% slower than the high-bandwidth approach (i.e., low-latency clock rate approximately 75% of high-bandwidth clock rate), but, due to single-cycle (rather than two-cycle) operation, yields a summation result approximately 33% faster than the high-bandwidth embodiment (i.e., the high bandwidth embodiment requires approximately 50% longer than the low-latency embodiment to yield a summation result). Various other break-cell dispositions (e.g., to reduce longest cell-chain length) may be implemented within the high-bandwidth and/or low-latency adder embodiments to further increase bandwidth or reduce latency.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific voltages, temperatures, temperature ranges, supply voltages, threshold voltages, transistor types, numbers of bits, signal path widths, signaling or operating frequencies and the like can be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A logic circuit comprising:
   a first input to receive a first input signal that transitions between upper and lower voltages of a first voltage domain;
   a second input to receive a second input signal that transitions between upper and lower voltages of a second voltage domain, the lower voltage of the second voltage domain exceeding the upper voltage of the first voltage domain; and
   circuitry to generate, based on the first and second input signals, an output-control signal that transitions between the lower supply voltage of the first voltage domain and the upper supply voltage of the second voltage domain.

2. The logic circuit of claim 1 further comprising first output circuitry to generate, at a first output node and based at least in part on transitions of the output-control signal, a first output signal that transitions between the upper and lower supply voltages of the first voltage domain.

3. The logic circuit of claim 2 further comprising second output circuitry to generate, at a second output node and based at least in part on transitions of the output-control signal, a second output signal that transitions between the upper and lower supply voltages of the second voltage domain.

4. The logic circuit of claim 2 wherein the first output circuitry to generate the first output signal comprises circuitry to switchably decouple the first output node from the lower supply voltage of the first voltage domain in response transition of the output-control signal from the upper supply voltage of the second voltage domain to the lower supply voltage of the first voltage domain.

5. The logic circuit of claim 4 wherein the circuitry to generate the output-control signal comprises circuitry to generate, as the output-control signal, first and second component control signals having complementary voltage levels such that the first component control signal transitions from the lower supply voltage of the first voltage domain to the upper supply voltage of the second voltage domain as the second component control signal transitions from the upper supply voltage of the second voltage domain to the lower supply voltage of the first domain and vice-versa, and wherein the circuitry to switchably decouple the first output node from the lower supply voltage of the first voltage domain in response to transition of the first output-control signal comprises circuitry to switchably decouple the first output node from the lower supply voltage of the first voltage domain in response to transition of the first component control signal from the upper supply voltage of the second voltage domain to the lower voltage of the first voltage domain.

6. The logic circuit of claim 5 wherein the circuitry to generate the first output signal further comprises circuitry to switchably couple the first output node to the upper supply voltage of the second voltage domain in response to transition of the second component control signal from the lower supply voltage of the first voltage domain to the upper supply voltage of the second voltage domain.

7. The logic circuit of claim 1 further comprising:
   an output node;
   a third input to receive a third input signal that transitions between the upper and lower supply voltages of the first voltage domain;
   a fourth input to receive a fourth input signal that transitions between the upper and lower supply voltages of the first voltage domain; and
   circuitry to (i) switchably couple the third input signal to the output node upon transition of the output-control signal to the lower supply voltage of the first voltage domain, and (ii) switchably couple the fourth input signal to the output node upon transition of the output-control signal to the upper supply voltage of the second voltage domain.

8. The logic circuit of claim 7 wherein the third input signal and the fourth input signal are complementary signals such that, as the third input signal transitions to the upper supply voltage of the first voltage domain, the fourth input signal transitions to the lower supply voltage of the first voltage domain and vice-versa.

9. A method of operation within a logic circuit, the method comprising:
   receiving a first input signal that transitions between upper and lower supply voltages of a first voltage domain;
   receiving a second input signal that transitions between upper and lower voltages of a second voltage domain, the lower voltage of the second voltage domain exceeding the upper voltage of the first voltage domain; and
   generating, based on the first and second input signals, an output-control signal that transitions between the lower supply voltage of the first voltage domain and the upper supply voltage of the second voltage domain.

10. The method of claim 9 further comprising generating, based at least in part on transitions of the output-control signal, a first output signal that transitions between the upper and lower supply voltages of the first voltage domain.

11. The method of claim 10 further comprising generating, based at least in part on transitions of the output-control signal, a second output signal that transitions between the upper and lower supply voltages of the second voltage domain.

12. The method of claim 10 wherein generating the first output signal comprises switchably decoupling a first output node from the lower supply voltage of the first voltage domain in response transition of the output-control signal from the upper supply voltage of the second voltage domain to the lower supply voltage of the first voltage domain.

13. The method of claim 12 wherein generating the output-control signal comprises generating first and second component control signals having complementary voltage levels such that the first component control signal transitions from the lower supply voltage of the first voltage domain to the upper supply voltage of the second voltage domain as the second component control signal transitions from the upper supply voltage of the second voltage domain to the lower supply voltage of the first domain and vice-versa, and wherein switchably decoupling the first output node from the lower supply voltage of the first voltage domain in response to transition of the first output-control signal comprises switchably decoupling the first output node from the lower supply voltage of the first voltage domain in response to transition of the first component control signal from the upper supply voltage of the second voltage domain to the lower voltage of the first voltage domain.

14. The method of claim 13 wherein generating the first output signal further comprises switchably coupling the first output node to the upper supply voltage of the second voltage domain in response to transition of the second component control signal from the lower supply voltage of the first voltage domain to the upper supply voltage of the second voltage domain.

15. The method of claim 9 further comprising:
receiving a third input signal that transitions between the upper and lower supply voltages of the first voltage domain;
receiving a fourth input signal that transitions between the upper and lower supply voltages of the first voltage domain;
switchably coupling the third input signal to an output node of the logic circuit upon transition of the output-control signal to the lower supply voltage of the first voltage domain; and
switchably coupling the fourth input signal to the output node upon transition of the output-control signal to the upper supply voltage of the second voltage domain.

16. The method of claim 15 wherein the third input signal and the fourth input signal are complementary signals such that, as the third input signal transitions to the upper supply voltage of the first voltage domain, the fourth input signal transitions to the lower supply voltage of the first voltage domain and vice-versa.

17. A combinational logic circuit comprising:
a first inverter formed by first and second transistors coupled in series between upper and lower supply voltages of a first voltage domain;
a second inverter formed by third and fourth transistors coupled in series between upper and lower supply voltages of a second voltage domain, the lower supply voltage of the second voltage domain exceeding the upper supply voltage of the first voltage domain; and
a logic gate having:
a first input coupled to an output of the first inverter,
a second input coupled to an output of the second inverter, and
a third inverter formed by fifth and sixth transistors coupled in series between the upper supply voltage of the second voltage domain and the lower supply voltage of the first voltage domain.

18. The combinational logic circuit of claim 17 wherein gate terminals of the fifth and sixth transistors are coupled to one another to implement an input of the third inverter and drain terminals of the fifth and sixth transistors are coupled to one another to implement an output of the third inverter, the combinational logic circuit further comprising a first output circuit having seventh and eighth transistors coupled in series between the upper and lower supply voltages of the first voltage domain, the seventh and eighth transistors having gate terminals coupled respectively to the output and input of the third inverter.

19. The combinational logic circuit of claim 18 further comprising a second output circuit having ninth and tenth transistors coupled in series between the upper and lower supply voltages of the second voltage domain, the ninth and tenth transistors having gate terminals coupled respectively to the input and output of the third inverter.

20. The combinational logic circuit of claim 17 wherein the first, third and fifth transistors comprise p-type metal-oxide-semiconductor (MOS) transistors and the second, fourth and sixth transistors comprise n-type MOS transistors.

* * * * *